(12) United States Patent
Levin et al.

(10) Patent No.: US 7,283,593 B2
(45) Date of Patent: Oct. 16, 2007

(54) DISTANCE DETERMINATIONS ASSOCIATED WITH A TRELLIS DECODER

(75) Inventors: Yury D. Levin, Hopkinton, MA (US); Jeffrey S. Cohen, Acton, MA (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 10/600,502

(22) Filed: Jun. 20, 2003

(65) Prior Publication Data
US 2005/0002466 A1    Jan. 6, 2005

(51) Int. Cl.
*H04L 23/02* (2006.01)
(52) U.S. Cl. ............... 375/265; 375/341; 375/261; 375/262; 375/324; 375/332; 714/792; 714/795; 714/796

(58) Field of Classification Search ............... 375/265, 375/341, 261, 262, 324, 332; 714/792, 795, 714/796
See application file for complete search history.

(56) References Cited

U.S. PATENT DOCUMENTS

| 5,651,032 | A | * | 7/1997 | Okita | 375/341 |
| 5,844,945 | A | * | 12/1998 | Nam et al. | 375/341 |
| 6,094,739 | A | * | 7/2000 | Miller et al. | 714/792 |
| 2002/0159535 | A1 | * | 10/2002 | Agami et al. | 375/261 |
| 2003/0110444 | A1 | * | 6/2003 | Sakagami et al. | 715/503 |

* cited by examiner

*Primary Examiner*—Chieh M. Fan
*Assistant Examiner*—Eva Zheng
(74) *Attorney, Agent, or Firm*—Buckley, Maschoff & Talwalker LLC (57) ABSTRACT

According to some embodiments, distances associated with a Trellis decoder are determined.

14 Claims, 12 Drawing Sheets

```
┌─────────────────────────────────┐
│ RECEIVE X AND Y VALUES ASSOCIATED│
│   WITH DIFFERENCES BETWEEN      │
│    A RECEIVED LOCATION AND A    │
│    PRE-DETERMINED LOCATION   802│
└─────────────────────────────────┘
                 │
                 ▼
┌─────────────────────────────────┐
│  ESTIMATE DISTANCE BETWEEN THE  │
│     RECEIVED LOCATION AND THE   │
│ PRE-DETERMINED LOCATION BASED ON│
│   ONE OF THE X AND Y VALUES  804│
└─────────────────────────────────┘
```

DISTANCE DETERMINATIONS ASSOCIATED WITH A TRELLIS DECODER

BACKGROUND

A modem can be used to exchange information through a communication network. Moreover, the modem may include a data pump to facilitate the exchange of information in accordance with a particular protocol. For example, the data pump might be adapted to receive and transmit data over a telephone wire in accordance with a Digital Subscriber Line (DSL) protocol.

DETAILED DESCRIPTION

Some embodiments of the present invention are associated with the exchange of data through a channel (e.g., a telephone wire). To increase the rate at which information can be exchanged, the channel's bandwidth may be divided into a number of subchannels (and data can be simultaneously transmitted via each subchannel). For example, 1.1 MegaHertz (MHz) of available bandwidth could be divided into 256 separate subchannels, also referred to as "tones", each tone having a bandwidth of 4 KiloHertz (KHz).

To further improve performance, phase and amplitude modulation may be used to increase the amount of information that can be simultaneously transmitted using a particular tone. For example, a phase value can represent an angle and an amplitude value can represent a distance as illustrated by the X-Y axis 100 in FIG. 1. In this case, referred to as Quadrature Phase Shift Keying (QPSK), different phase and amplitude combinations will represent different points on the axis 100, and each point can be associated with a particular combination of bits (e.g., "10" or "11"). Such an approach is referred to as "constellation" mapping.

Figure 1:
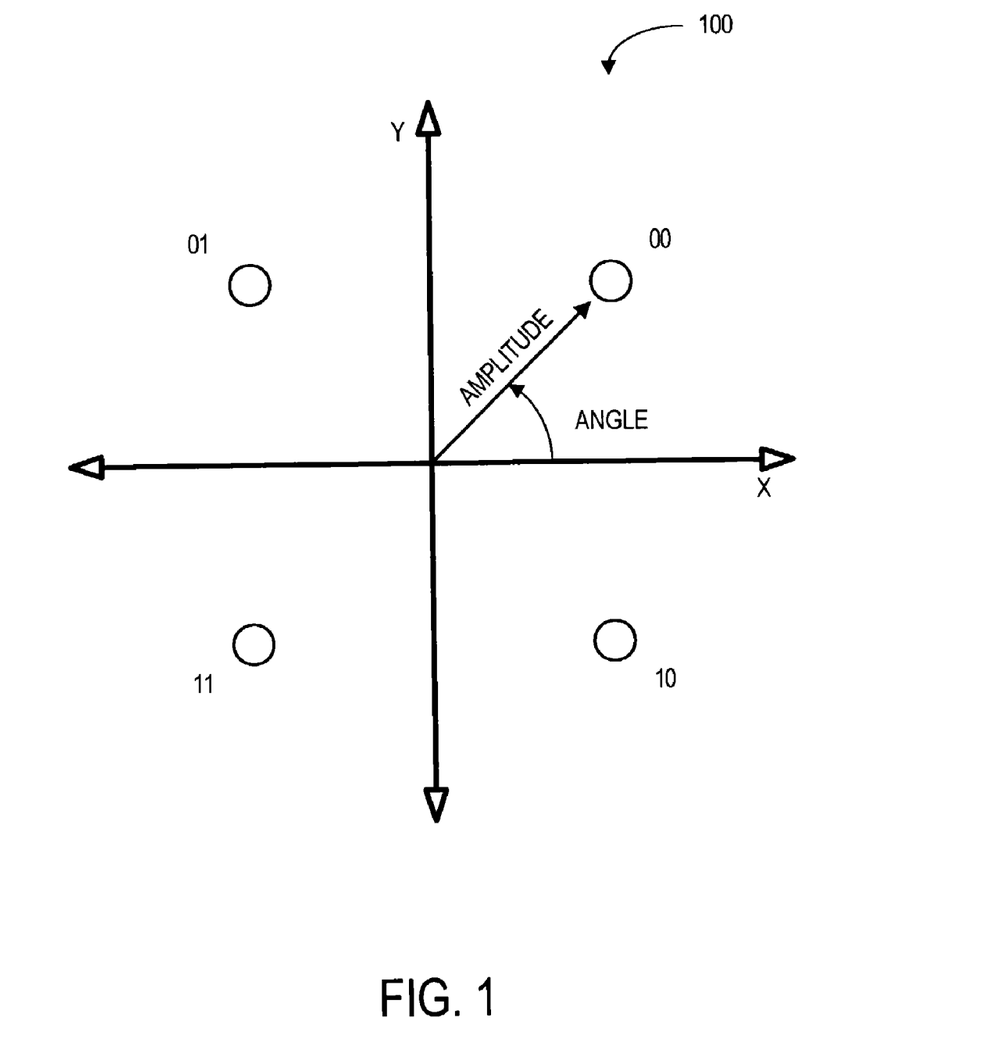
FIG. 1 illustrates an X-Y axis and a constellation pattern.
Figure 2:
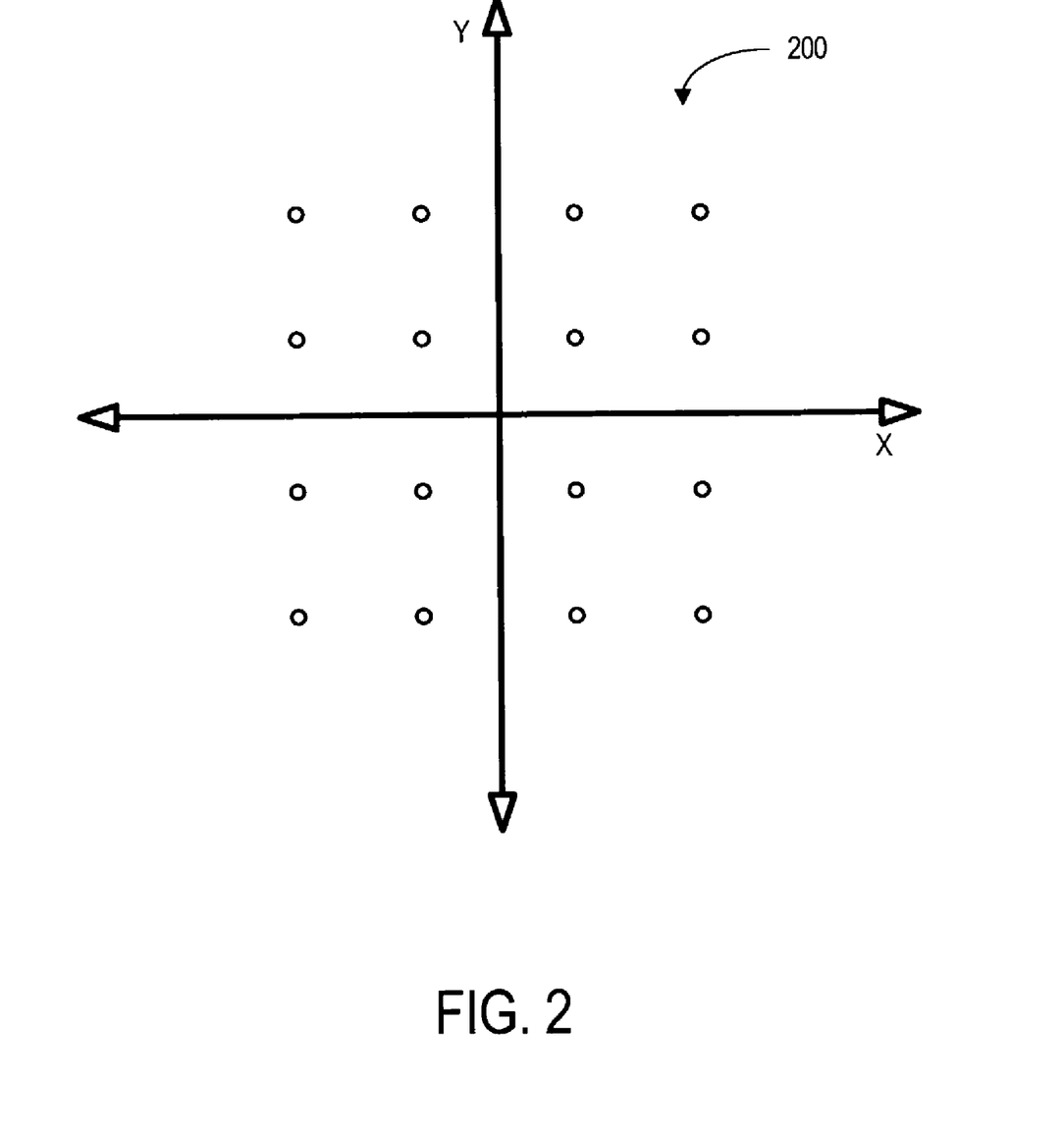
FIG. 2 illustrates another example of an X-Y axis and a constellation pattern.

Although four constellation points are illustrated in FIG. 1, other numbers of points may be defined. For example, FIG. 2 illustrates sixteen constellation points 200 in accordance with Quadrature Amplitude Modulation (QAM). Similarly, QAM-64 provides sixty-four constellation points (and up to six bits of data might be associated with each constellation point).

When a signal is received (e.g., at a modem), noise and other factors associated with the signal may prevent the location of received signal on an X-Y axis from exactly matching the intended constellation point. That is, a large enough error in the phase or angle information may cause an incorrect point in the constellation to be interpreted (resulting in an error in the exchanged data). To address this problem, Trellis Coded Modulation (TCM) combines coding and error correction techniques by adding additional bits that can be used to determine what data that was actually transmitted. In one approach, two tones are paired and Trellis encoding/decoding is performed on the pair of tones. Examples of this approach include the International Telecommunication Union (ITU) Recommendation G.992.1 entitled "Asymmetrical Digital Subscriber Line (ADSL) Transceivers" (1999), Recommendation G.992.2 entitled "Splitterless Asymmetric Digital Subscriber Line (ADSL) Transceivers" (1999), and ITU Recommendation G.992.3 entitled "Asymmetrical Digital Subscriber Line (ADSL) Transceivers-2 (ADSL2)" (2002).

Figure 3:
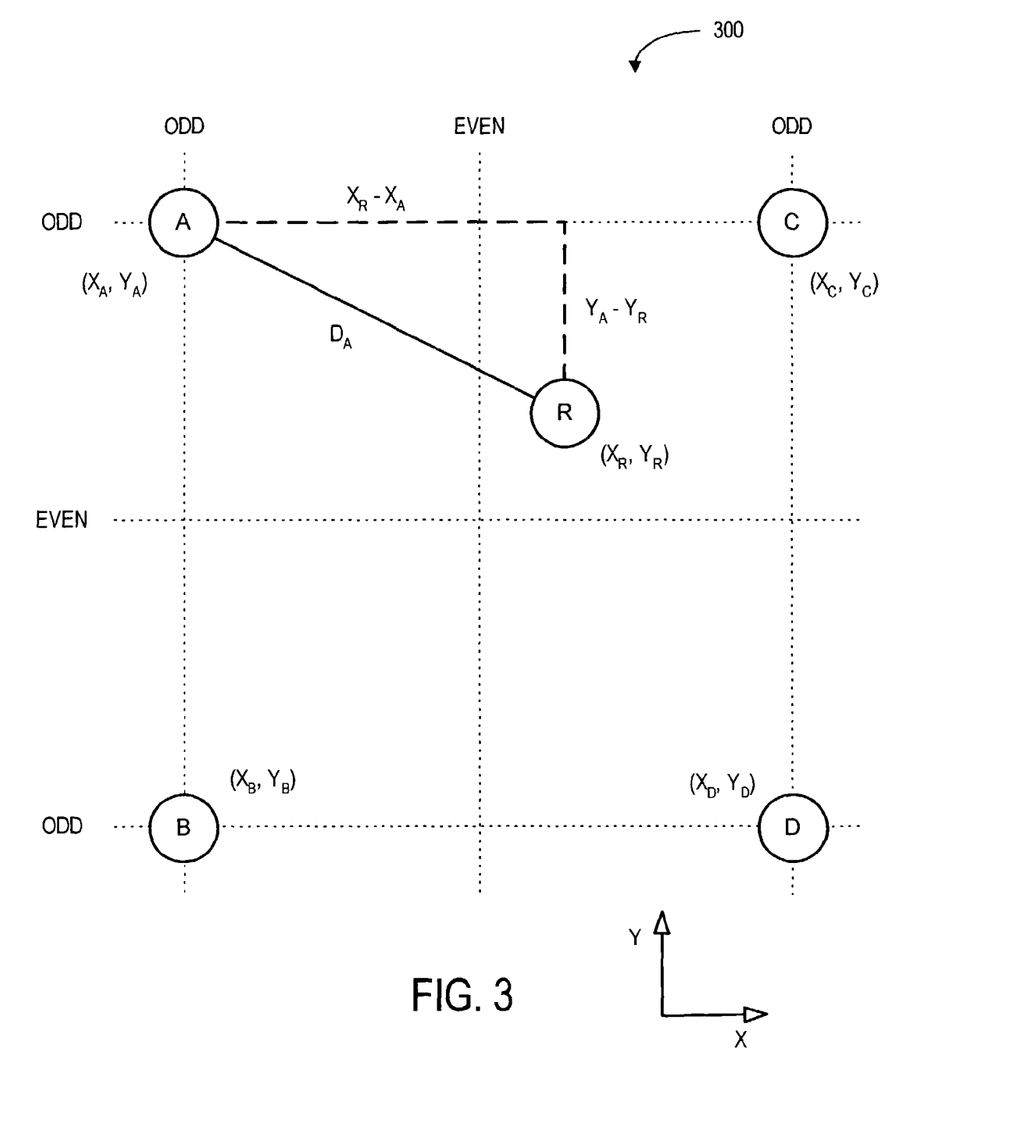
FIG. 3 illustrates a received location and pre-determined constellation points.

FIG. 3 illustrates an X-Y axis 300 for a particular tone along with a received location R as defined by $(X_R, Y_R)$. Also illustrated are four pre-determined constellation points A, B, C, and D as defined by $(X_A, Y_A)$ through $(X_D, Y_D)$.

Note that the location R does not exactly map to any of the constellation points.

A determination as to which constellation point is represented by R may be based on information associated with the distances between R and each constellation point: $D_A$ (the distance between location R and constellation point A), $D_B$, $D_C$, and $D_D$.

In particular, a Trellis operation may be associated with the squares of these Euclidean distances as defined by the Pythagorean Theorem:

$$D_A^2 = (X_R - X_A)^2 + (Y_R - Y_A)^2$$

$$D_B^2 = (X_R - X_B)^2 + (Y_R - Y_B)^2$$

$$D_C^2 = (X_R - X_C)^2 + (Y_R - Y_C)^2$$

$$D_D^2 = (X_R - X_D)^2 + (Y_R - Y_D)^2$$

Thus, a number of differences (e.g., $X_R - X_A$) may be calculated during the Trellis operation.

Difference Calculations

As can be seen in FIG. 3, some of the differences associated with the received location R and the constellation points may be equal. In particular:

$(X_R - X_A)$ may equal $(X_R - X_B)$;

$(X_R - X_C)$ may equal $(X_R - X_D)$;

$(Y_R - Y_A)$ may equal $(Y_R - Y_C)$; and $(Y_R - Y_B)$ may equal $(Y_R - Y_D)$.

In accordance with some embodiments, the pre-determined constellation points A, B, C, and D are located at each (and every) odd axis value.

Figure 4:
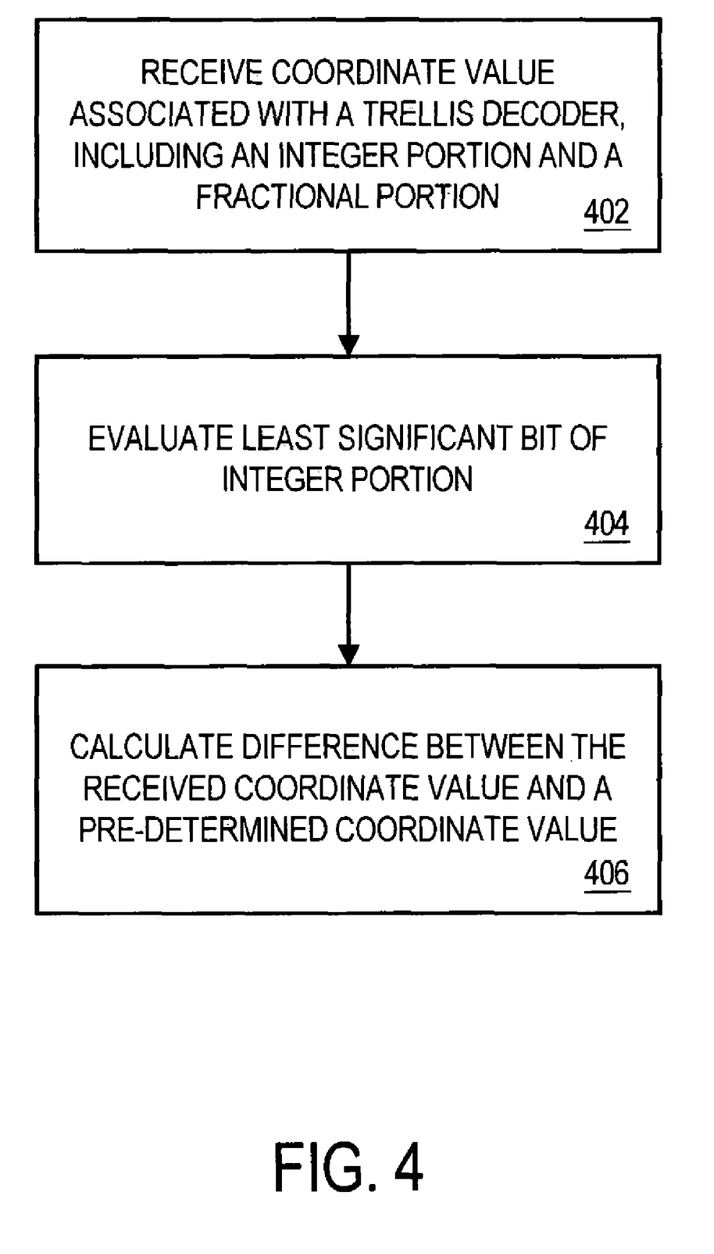
FIG. 4 is a method of calculating a difference according to some embodiments.

FIG. 4 is a flow chart of a method according to some embodiments. The flow charts described herein do not necessarily imply a fixed order to the actions, and embodiments may be performed in any order that is practicable. Note that any of the methods described herein may be performed by firmware, hardware, software, or any combination of these techniques. For example, a storage medium may store thereon instructions that when executed by a machine result in performance according to any of the embodiments described herein.

Figure 5:
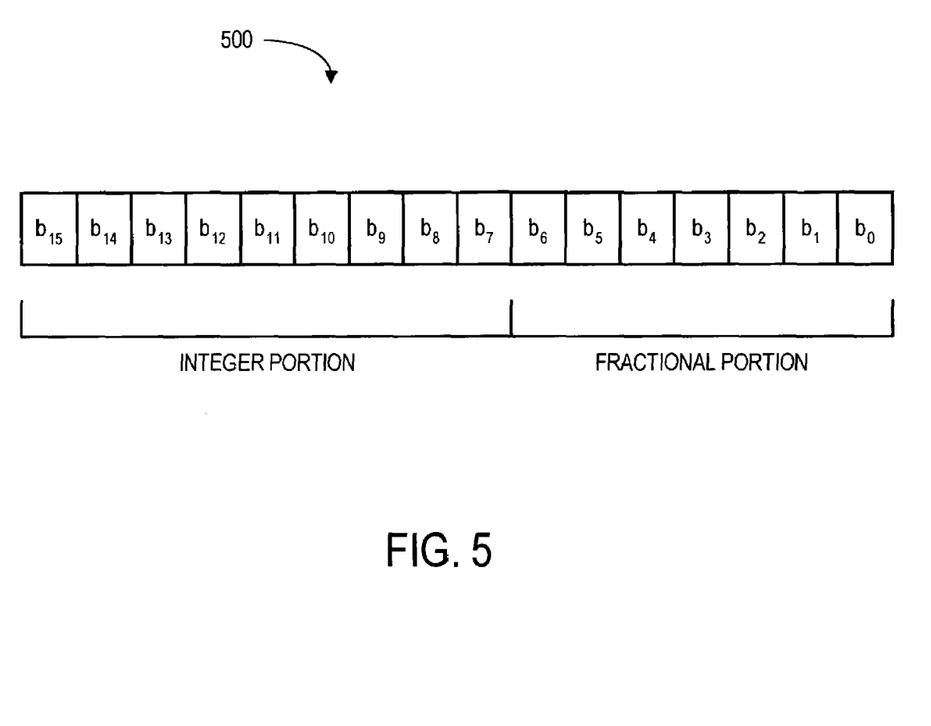
FIG. 5 illustrates a coordinate value according to some embodiments.

At 402, a coordinate value associated with a Trellis decoder is received. The coordinate value may be, for example, $X_R$ or $Y_R$. Moreover, the received coordinate value includes an integer portion and a fractional portion. For example, FIG. 5 illustrates a received coordinate value 500 in floating point format according to some embodiments. In this case, the sixteen-bit coordinate value 500 includes an integer portion (bits $b_{15}$ through $b_7$) and a fractional portion (bits $b_6$ through $b_0$).

Referring again to FIG. 4, the Least Significant Bit (LSB) of the integer portion (e.g., bit $b_7$) may be evaluated at 404. For example, the LSB may be evaluated to determine whether it is a zero or a one.

At 406, a difference between the received coordinate value and a pre-determined coordinate value is calculated based on the fractional portion and the evaluation. (e.g., without adding or subtracting the integer portion of the received coordinate value).

Consider, for example, the case when the received coordinate value is $X_R$. When the LSB of the integer portion is zero (and thus the integer portion is an even number), then:

$(X_R-X_A)=(X_R-X_B)=$one plus the fractional portion; and $(X_R-X_C)=(X_R-X_D)=$one minus the fractional portion (because the pre-determined constellation points A, B, C, D are located at each and every odd X-axis value). On the other hand, when the LSB of the integer portion is one (and the integer portion is an odd number):

$(X_R-X_A)=(X_R-X_B)=$the fractional portion; and $(X_R-X_C)=(X_R-X_D)=$two minus the fractional portion.

Now consider the case when the received coordinate value is $Y_R$. When the LSB of the integer portion is zero (and the integer portion is an even number), then:

$(Y_R-Y_A)=(Y_R-Y_C)=$one minus the fractional portion; and $(Y_R-Y_B)=(Y_R-Y_D)=$one plus the fractional portion.

On the other hand, when the LSB of the integer portion is one (and the integer portion is an odd number):

$(Y_R-Y_A)=(Y_R-Y_C)=$two minus the fractional portion; and $(Y_R-Y_B)=(Y_R-Y_D)=$the fractional portion.

Once the differences have been determined, distance values associated with distances between a received coordinate location (e.g., R) and one or more pre-determined constellation points (e.g., A, B, C, and D) may be calculated based at least in part on these differences (e.g., $D_A^2=(X_R-X_A)^2+(Y_R-Y_A)^2$). A Trellis decoding process may then be performed based at least in part on the distance values.

Difference Calculation Example

Figure 6:
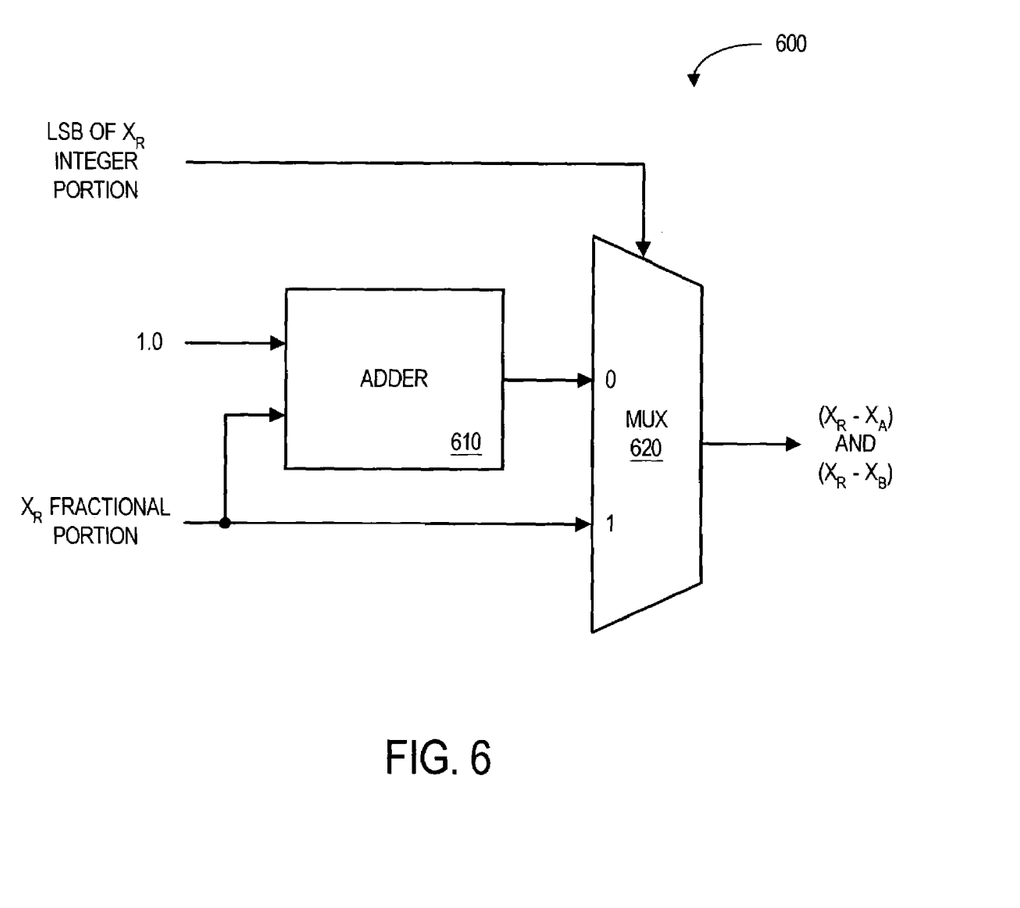
FIG. 6 is a block diagram of a circuit according to some embodiments.

FIG. 6 is a block diagram of a circuit 600 according to some embodiments. In particular, the circuit 600 outputs $(X_R-X_A)$ and $(X_R-X_B)$ based on the LSB of the integer portion and the fractional portion of $X_R$. An adder 610 receives a signal representing one ("1.0") along with the fractional portion of $X_R$. The adder 610 outputs one plus the fractional portion to a multiplexer 620. The multiplexer 620 also directly receives the fractional portion of $X_R$ along with the LSB of the integer portion as a control signal.

When the LSB of the integer portion of $X_R$ equals zero, the multiplexer 620 outputs one plus the fractional portion of $X_R$. When the LSB of the integer portion equals one, the multiplexer 620 outputs the fractional portion of $X_R$. In this way, the circuit 600 generates $(X_R-X_A)$ and $(X_R-X_B)$.

Although a particular circuit 600 has been illustrated, any number of other circuits could be used to generate $(X_R-X_A)$ and $(X_R-X_B)$. For example, an adder might receive the fractional portion of $X_R$ as one input along with an inverted version of the LSB of the integer portion of $X_R$ as another input. In this case, the output of the adder would also represent $(X_R-X_A)$ and $(X_R-X_B)$.

Note that the circuit 600 of FIG. 6 may also be used to generate $(Y_R-Y_B)$ and $(Y_R-Y_D)$. That is, the multiplexer 620 would output one plus the fractional portion of $Y_R$ when the LSB of the integer portion of $Y_R$ equals zero. When the LSB of the integer portion of $Y_R$ equals one, the multiplexer 620 would output the fractional portion of $Y_R$.

Moreover, a similar circuit could be used to generate $(X_R-X_C)$, $(X_R-X_D)$, $(Y_R-Y_A)$, and $(Y_R-Y_C)$. In this case, however, a multiplexer might receive one minus the fractional portion and two minus the fractional portion as inputs.

The constellation mapping, tone pairing, Trellis operations, and/or other functions described herein might be provided, for example, via a Field-Programmable Gate Array (FPGA) device or an Application Specific Integrated Circuit (ASIC) device. By using some or all of the embodiments described herein to calculate differences between coordinate values, the area and cost of such hardware might be reduced.

Figure 7:
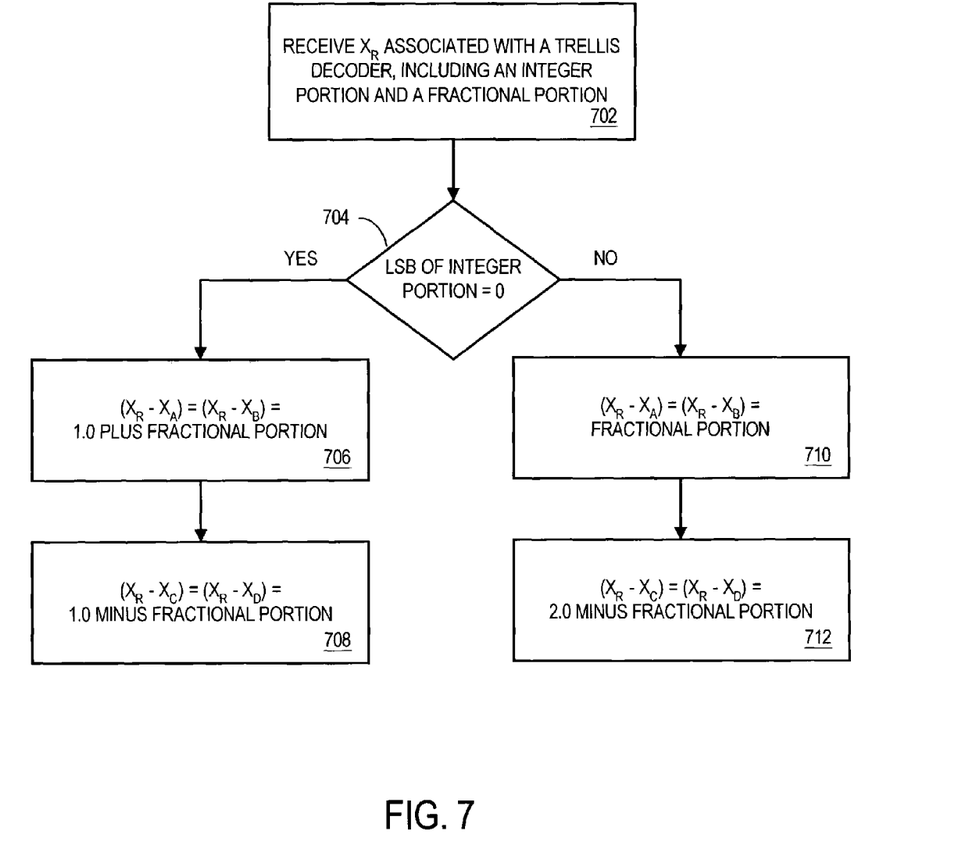
FIG. 7 is a method of calculating differences according to some embodiments.

FIG. 7 is a method of calculating differences according to some embodiments. At 702, an integer portion and a fractional portion of $X_R$ are received. If the LSB of the integer portion equals zero at 704 (the integer portion is an even number), the following differences are calculated at 706 and 708:

$(X_R-X_A)=(X_R-X_B)=$one plus the fractional portion; and $(X_R-X_C)=(X_R-X_D)=$one minus the fractional portion If the LSB of the integer portion equals one at 704 (the integer portion is an odd number), the following differences are calculated at 710 and 712:

$(X_R-X_A)=(X_R-X_B)=$the fractional portion; and $(X_R-X_C)=(X_R-X_D)=$two minus the fractional portion.

Distance Estimation

When the appropriate differences have been determined, the distances between a received location R and pre-determined constellation points A, B, C, and D may be calculated as follows:

$$D_A=\sqrt{(X_R-X_A)^2+(Y_R-Y_A)^2}$$

$$D_B=\sqrt{(X_R-X_B)^2+(Y_R-Y_B)^2}$$

$$D_C=\sqrt{(X_R-X_C)^2+(Y_R-Y_C)^2}$$

$$D_D=\sqrt{(X_R-X_D)^2+(Y_R-Y_D)^2}$$

The calculation of a square root value, however, can be a hardware intensive task. For example, iterative approaches may be difficult to implement in hardware.

Figure 8:
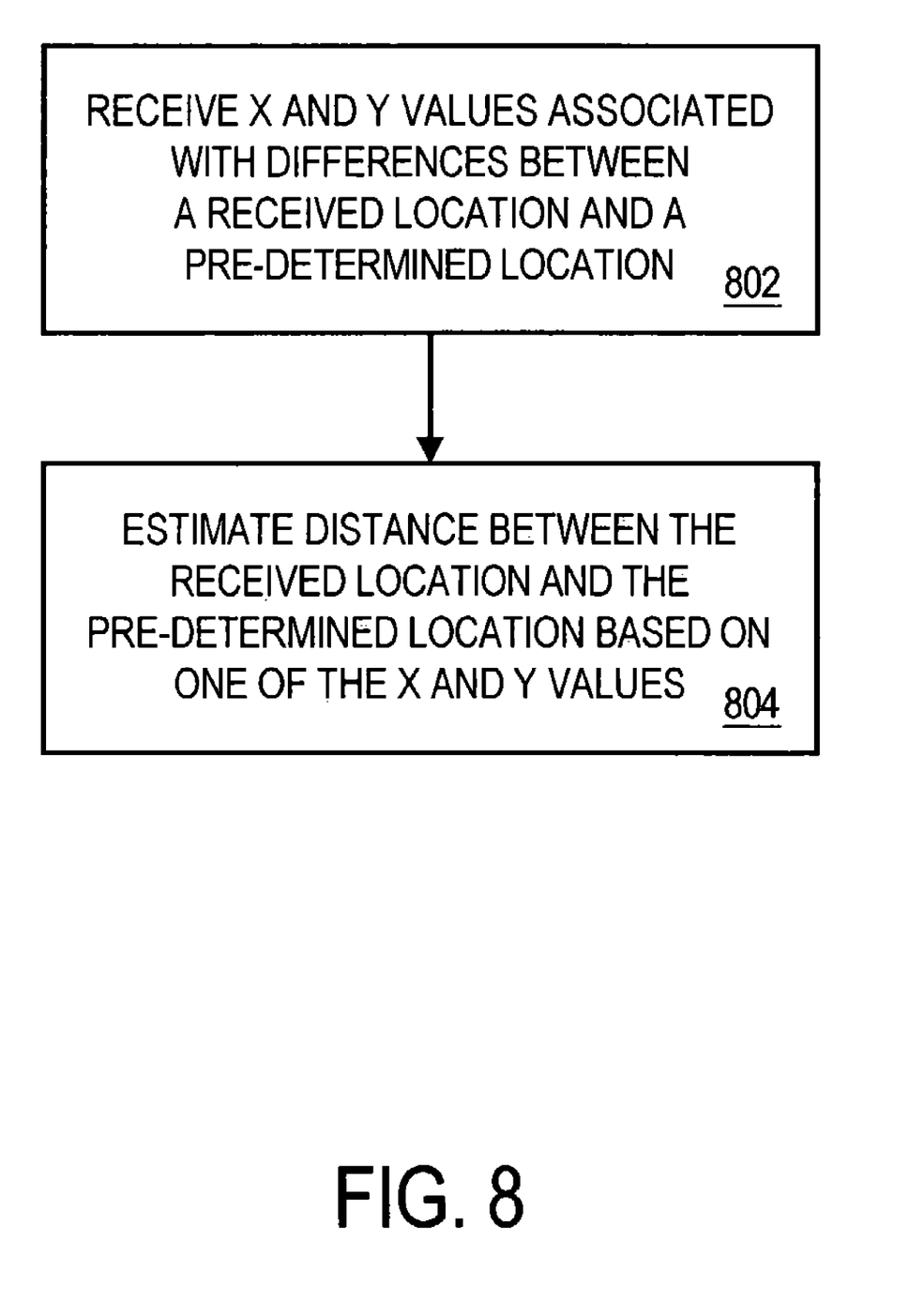
FIG. 8 is a method of estimating a distance according to some embodiments.

FIG. 8 is a method of estimating a distance according to some embodiments. At 802, X and Y values are received representing differences between a received location and a pre-determined constellation point associated with a Trellis decoder. For example, X might represent $(X_R-X_A)$ while Y represents $(Y_R-Y_A)$.

At 804, a distance between the received location and the pre-determined constellation point is estimated based on one of the X and Y values. For example, according to some embodiments, a modified Taylor series is used to estimate the distance. In particular, when X is greater than Y, the distance may be estimated as the X value multiplied by a pre-determined value. When Y is greater than X, the distance may be estimated as the Y value multiplied by the pre-determined value.

Distance Estimation Example

Figure 9:
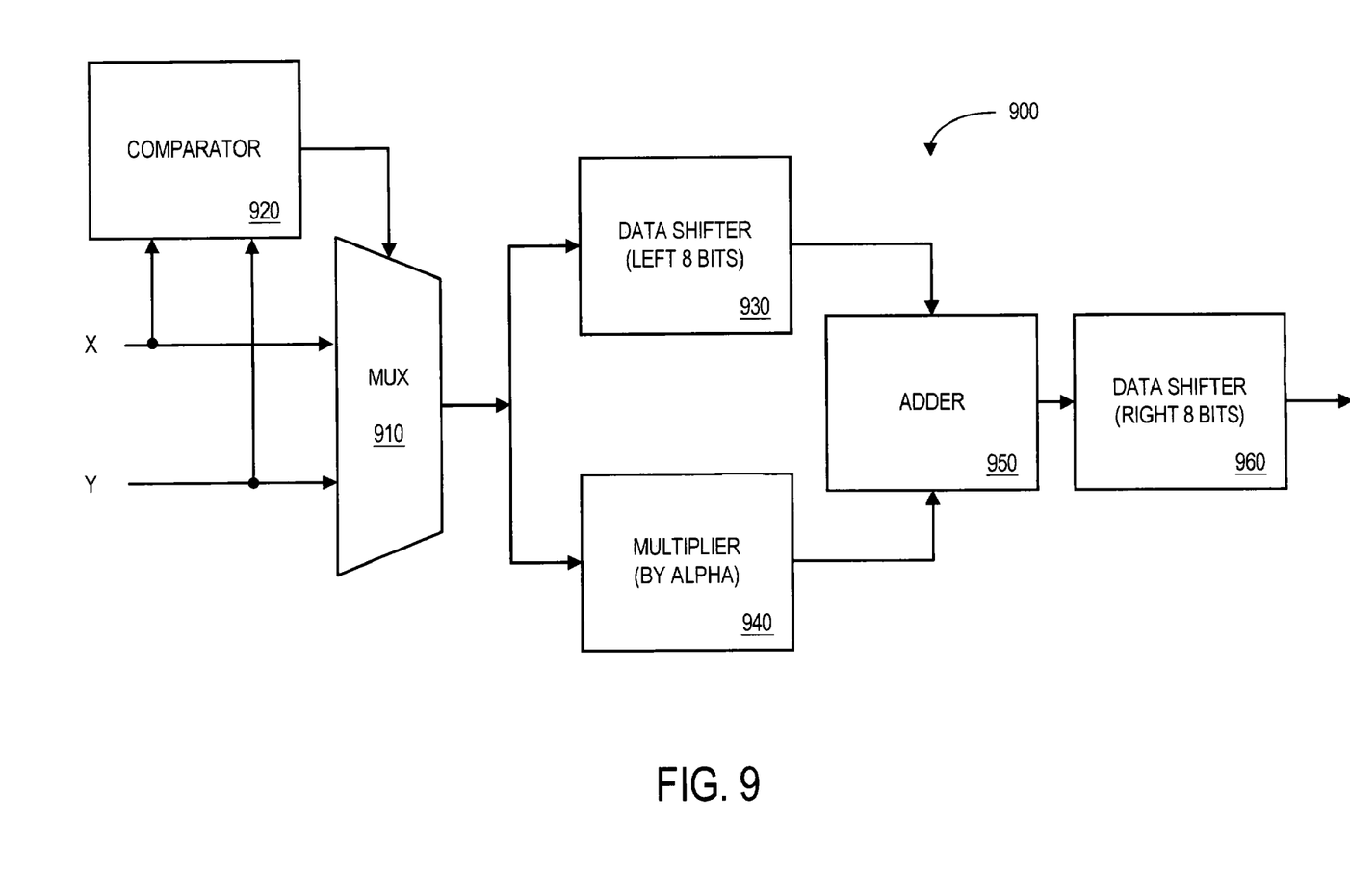
FIG. 9 is a block diagram of a circuit according to some embodiments.

FIG. 9 is a block diagram of a circuit 900 according to some embodiments. A multiplexer 910 receives the X and Y values (e.g., representing differences between a received location and a pre-determined constellation point). The X and Y values are also provided to a comparator 920 that controls the multiplexer 910 such that the output of the multiplexer 910 will be the larger of the X and Y values.

The output of the multiplexer 910 is provided to a data shifter 930 that shifts the value left by eight bits (e.g., multiplying the value by 256). The output of the multiplexer 910 is also provided to a multiplier 940 that multiplies the value by a pre-determined constant alpha (e.g., 87). The constant alpha may be, for example, obtained empirically during the design, testing, and/or operation of the circuit 900.

An adder 950 receives signals from the data shifter 930 and the multiplier 940 and provides a signal to another data shifter 960 where the value is shifted right by eight bits (e.g., dividing the value by 256). The result may then be used as an estimation of the distance defined by defined by the X and Y values (e.g., the distance from a received location to a pre-determined constellation point).

Figure 10:
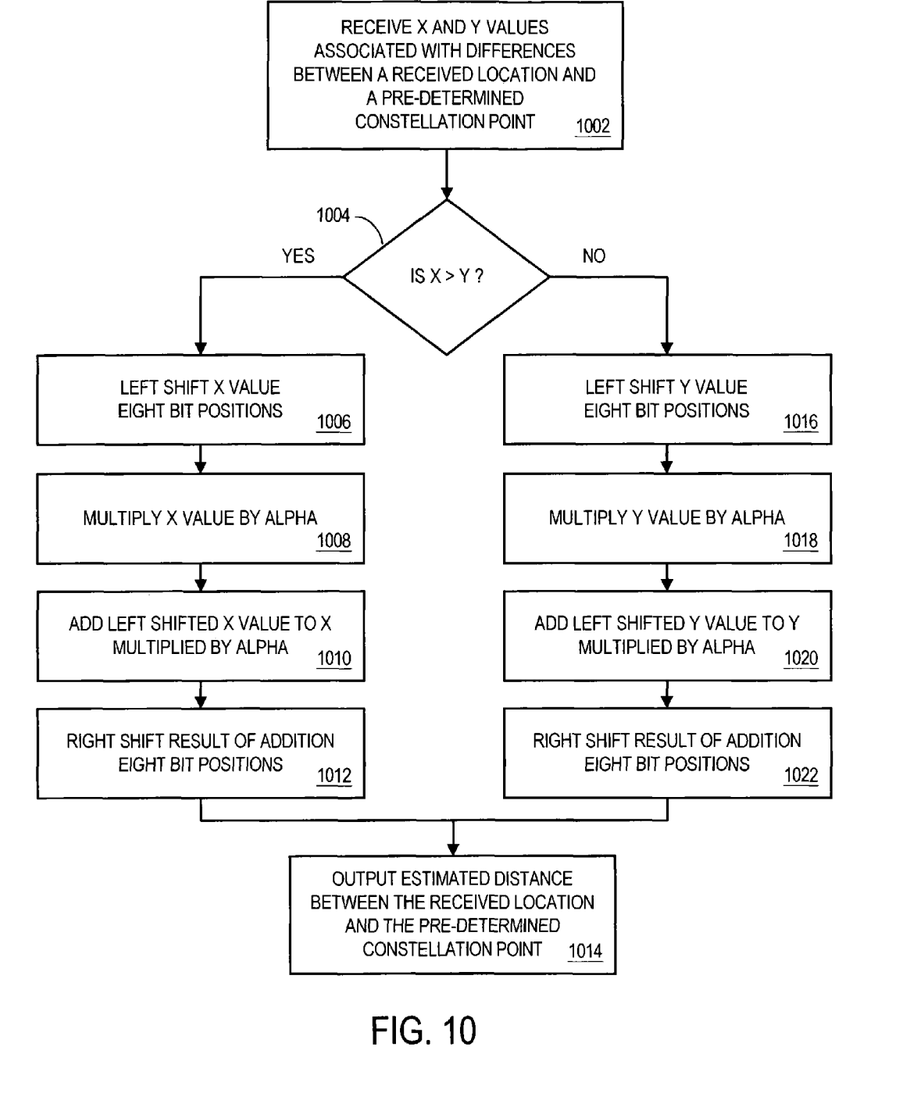
FIG. 10 is a method of estimating a distance according to some embodiments.

FIG. 10 is a method of estimating a distance according to some embodiments. At 1002, X and Y values are received (e.g., representing differences between a received location and a pre-determined constellation point). If X is greater than Y at 1004, then the X value is shifted left by eight bits at 1006. The X value is also multiplied by alpha at 1008 and the two results are added at 1010. The new value is shifted right by eight bits at 1012 and an estimated distance is output at 1014.

If Y is greater than X at 1004, then the Y value is shifted left by eight bits at 1016. The Y value is also multiplied by alpha at 1018 and the two results are added at 1020. The new value is shifted right by eight bits at 1022 and an estimated distance is output at 1014. As a result, the distance may be estimated without calculating a square root value (e.g., to allow for a more efficient hardware implementation). Although some error may be introduced during the process, the error may be limited based on values selected (e.g., a particular amount of bit shifting and a particular alpha might result in a 6% error).

Systems

Figure 11:
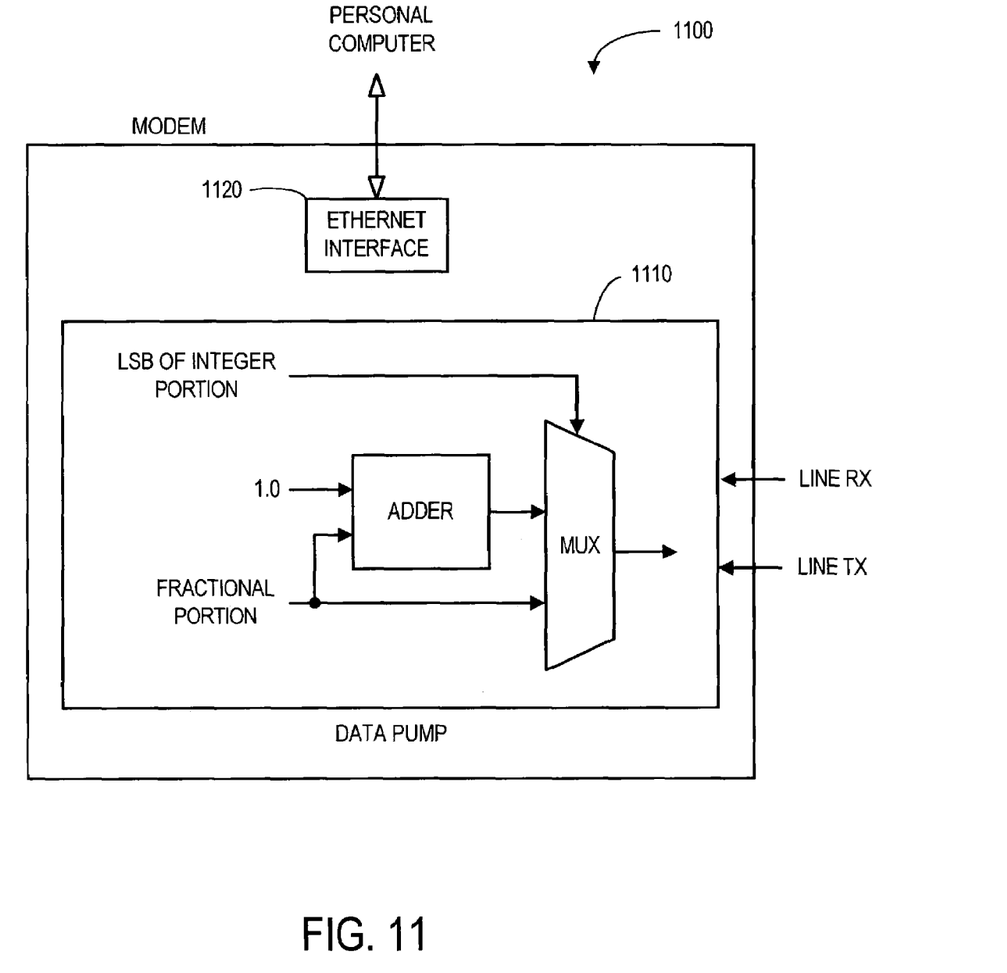
FIG. 11 is a block diagram of a modem according to some embodiments.

FIG. 11 is a block diagram of a modem 1100, such as an Intel® PRO/DSL 3200 modem, according to some embodiments. The modem may, for example, exchange information between a Personal Computer (PC) and a remote device (e.g., via line Tx and line Rx). The modem 1100 includes an ADSL data pump 1110 in accordance with any of the embodiments described herein. For example, the data pump 1110 may include an input path to receive a coordinate value, the received coordinate value including an integer portion and a fractional portion. Moreover, the data pump 1110 may include a multiplexer to receive (i) the fractional portion, (ii) a the fractional portion plus one, and (iii) the least significant bit of the integer portion as a control signal. The modem 1100 may also include an Ethernet interface 1120 (e.g., to exchange information with the PC). According to other embodiments the modem 1100 includes a Universal Serial Bus (USB) interface instead of, or in addition to, the Ethernet interface 1120.

Figure 12:
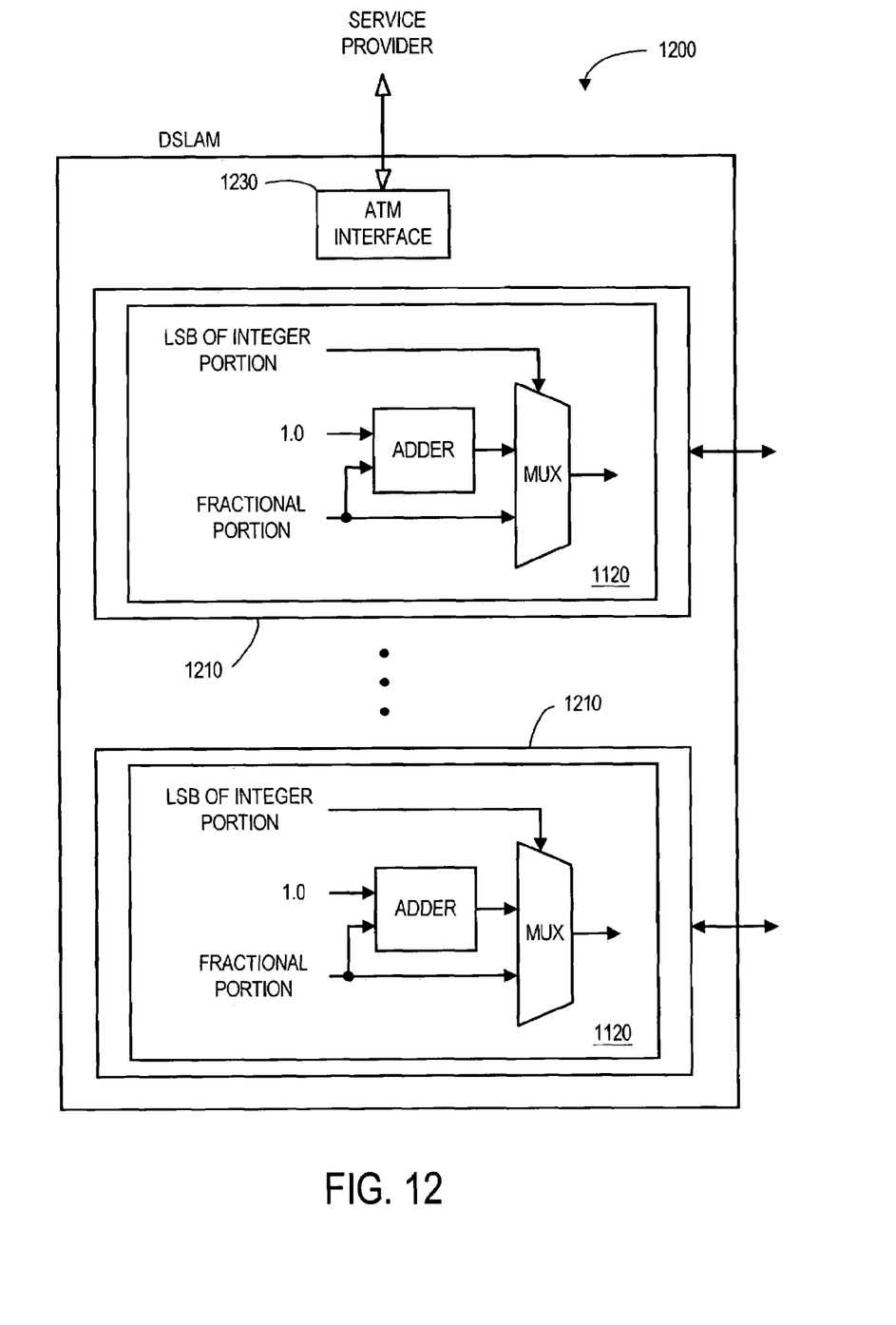
FIG. 12 is a block diagram of a digital subscriber line access multiplexer according to some embodiments.

FIG. 12 is a block diagram of a Digital Subscriber Line Access Multiplexer (DSLAM) 1200 according to some embodiments. The DSLAM 1200 may be located at, for example, a telephone company central office. The DSLAM 1200 includes a bank of modems 1210 that exchange information with multiple remote devices (e.g., subscriber modems). One or more of the modems 1210 may include an ADSL data pump 1220 in accordance with any of the embodiments described herein. For example, the data pump 1220 may include an input path to receive a coordinate value, the received coordinate value including an integer portion and a fractional portion. Moreover, the data pump 1220 may include a multiplexer to receive (i) the fractional portion, (ii) a the fractional portion plus one, and (iii) the least significant bit of the integer portion as a control signal. The DSLAM 1200 may also include an Asynchronous Transfer Mode (ATM) interface 1230 (e.g., to exchange information with an Internet service provider). According to other embodiments the DSLAM 1200 includes an interface to another high-speed back bone instead of, or in addition to, the ATM interface 1230.

ADDITIONAL EMBODIMENTS

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular ASDL standards are referred to herein, embodiments of the present invention can be used with respect to other standards and/or situations in which differences and/or distances are calculated. Similarly, although particular circuits have been described, embodiments may be implemented using different circuit designs.

The several embodiments described herein are solely for the purpose of illustration. Persons skilled in the art will recognize from this description other embodiments may be practiced with modifications and alterations limited only by the claims.

What is claimed is:

1. An apparatus, comprising:
  an input line to receive an X value and a Y value representing differences between a received location and a pre-determined constellation point associated with a Trellis decoder; and
  a decoder to:
    estimate a distance between the received location and the pre-determined constellation point based on one of the X and Y values, wherein said estimating comprises:
      estimating the distance as the X value multiplied by a pre-determined value when the X value is larger than the Y value, and estimating the distance as the Y value multiplied by the pre-determined value when the Y value is larger than the X value.

2. The apparatus of claim 1, wherein said estimating when the X value is larger than the Y value comprises:
left shifting the X value a pre-determined number of bits;
adding (i) the shifted X value to (ii) the X value multiplied by a pre-determined constant; and
right shifting the result of the addition a pre-determined number of bits.

3. The apparatus of claim 1, wherein said estimating when the Y value is larger than the X value comprises:
left shifting the Y value a pre-determined number of bits;
adding (i) the shifted Y value to (ii) the Y value multiplied by a pre-determined constant; and
right shifting the result of the addition a pre-determined number of bits.

4. A method, comprising:
receiving via an input path an X value and a Y value representing differences between a received location and a pre-determined constellation point associated with a Trellis decoder;
estimating a distance between the received location and the pre-determined constellation point based on one of the X and Y values, wherein said estimating comprises:
estimating the distance as the X value multiplied by a pre-determined value when the X value is larger than the Y value, and
estimating the distance as the Y value multiplied by the pre-determined value when the Y value is larger than the X value; and
outputting via an output path an indication of the estimated distance.

5. The method of claim 4, wherein said estimating when the X value is larger than the Y value comprises:
left shifting the X value a pre-determined number of bits;
adding (i) the shifted X value to (ii) the X value multiplied by a pre-determined constant; and
right shifting the result of the addition a pre-determined number of bits.

6. The method of claim 4, wherein said estimating when the Y value is larger than the X value comprises:
left shifting the Y value a pre-determined number of bits;
adding (i) the shifted Y value to (ii) the Y value multiplied by a pre-determined constant; and
right shifting the result of the addition a pre-determined number of bits.

7. A computer-readable storage medium having stored thereon instructions that when executed by a machine result in the following:

receiving via an input path an X value and a Y value representing differences between a received location and a pre-determined constellation point associated with a Trellis decoder;
estimating a distance between the received location and the pre-determined constellation point based on one of the X and Y values, wherein said estimating comprises:
estimating the distance as the X value multiplied by a pre-determined value when the X value is larger than the Y value, and
estimating the distance as the Y value multiplied by the pre-determined value when the Y value is larger than the X value; and
outputting via an output path an indication of the estimated distance.

8. A system, comprising:
an apparatus, including:
an input line to receive an X value and a Y value representing differences between a received location and a pre-determined constellation point associated with a Trellis decoder; and
a decoder to:
estimate a distance between the received location and the pre-determined constellation point based on one of the X and Y values, wherein said estimating comprises:
estimating the distance as the X value multiplied by a pre-determined value when the X value is larger than the Y value, and
estimating the distance as the Y value multiplied by the pre-determined value when the Y value is larger than the X value; and
a communication interface.

9. The system of claim 8, wherein the system is a modem.

10. The system of claim 8, wherein the system is a digital subscriber line access multiplexer.

11. The system of claim 8, wherein the apparatus an asynchronous digital subscriber line data pump.

12. The system of claim 8, wherein the apparatus is a modem.

13. The system of claim 8, wherein the communication interface is an Ethernet interface.

14. The system of claim 8, wherein the communication interface is an asynchronous transfer mode interface.

* * * * *